(12) United States Patent
Bao et al.

(10) Patent No.: US 6,887,790 B1
(45) Date of Patent: May 3, 2005

(54) METHOD OF FORMING DUMMY COPPER PLUG TO IMPROVE LOW K STRUCTURE MECHANICAL STRENGTH AND PLUG FILL UNIFORMITY

(75) Inventors: Tien-I Bao, Hsin-chu (TW); Bi-Trong Chen, Tainan (TW); Ying-Ho Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/199,856

(22) Filed: Jul. 19, 2002

(51) Int. Cl.⁷ .............................................. H01L 21/44
(52) U.S. Cl. ....................... 438/687; 438/629; 438/637; 438/672; 438/675; 438/622
(58) Field of Search .................. 438/687, 637–640, 438/633–634, 629, 672, 675

(56) References Cited

U.S. PATENT DOCUMENTS

| | | | |
|---|---|---|---|
| 6,016,000 A | * | 1/2000 | Moslehi ...................... 257/522 |
| 6,087,733 A | | 7/2000 | Maxim et al. ............... 257/797 |
| 6,103,626 A | | 8/2000 | Kim ............................ 438/691 |
| 6,150,232 A | | 11/2000 | Chan et al. .................. 438/421 |
| 6,259,115 B1 | | 7/2001 | You et al. ...................... 257/48 |
| 6,274,485 B1 | * | 8/2001 | Chen et al. .................. 438/652 |
| 6,380,087 B1 | * | 4/2002 | Gupta et al. ................. 438/692 |
| 6,582,974 B2 | * | 6/2003 | Lui et al. ........................ 438/6 |

* cited by examiner

Primary Examiner—Thanh Nguyen
(74) Attorney, Agent, or Firm—Haynes and Boone, LLP

(57) ABSTRACT

A new method is provided for the creation of dummy plugs in support of creating a robust structure of overlying interconnect traces. A pattern of holes for dummy plugs is etched stopping at an etch stop layer, the etch stop layer is then removed from the bottom of the holes that have been created whereby this removal is extended into an underlying layer of insulating material. The pattern of holes is filled with a metal, preferably copper, excess metal is removed by methods of Chemical Mechanical Polishing, leaving in place a pattern of metal plugs that penetrate through layers of insulation material and through layers of etch stop material and into an underlying layer of semiconductor material.

45 Claims, 2 Drawing Sheets

METHOD OF FORMING DUMMY COPPER PLUG TO IMPROVE LOW K STRUCTURE MECHANICAL STRENGTH AND PLUG FILL UNIFORMITY

BACKGROUND OF THE INVENTION (1) Field of the Invention

The invention relates to the fabrication of integrated circuit devices, and more particularly, to a method for the improvement of low-k dielectric material structural strength by creating a dummy plug having good plug fill uniformity.

(2) Description of the Prior Art

The creation of semiconductor devices frequently comprises creating patterns of conducting interconnect lines, which is typically a combination of the deposition of layers of dielectric and layers of conductive materials such as metal. The deposited layers of metal are patterned and etched, forming one or more layers of interconnect traces in or over the layers of dielectric.

The continuing effort to reduce the size of individual transistors and other devices commonly integrated on a semiconductor chip and to increase the density of Integrated Circuits results in a continuing reduction of the separation between conducting layers of materials. To further enhance semiconductor device performance, the use of low-k dielectric constant dielectric materials is of advantage. For instance, the parasitic capacitance between adjacent conducting lines is highly dependent on the dielectric constant of the insulator or dielectric used to separate the conducting lines. Conventional semiconductor fabrication typically uses silicon dioxide as a dielectric; this has a dielectric constant of about 3.9. The lowest possible and therefore the ideal dielectric constant is 1.0, this is the dielectric constant of a vacuum whereas air has a dielectric constant of slightly larger than 1.0.

The use of many of the low dielectric constant materials is not feasible due to the fact that equipment is not available to properly process the new dielectric material in various integrated circuits. Also, the chemical or physical properties of many low dielectric constant materials are usually difficult to make compatible with or integrate into conventional integrated circuit processing.

A major objective in the design of Integrated Circuit (IC) devices is to reduce the dielectric constant (k) of the insulating layer between adjacent conductor lines of semiconductor circuits. With the reduction in device dimensions, overlying layers of insulation are accordingly reduced in thickness while more layers of interconnect traces are created as overlying layers. From this results the need for good surface planarity (flatness), a requirement that particularly applies to the lower layers of a stack of overlying layers since lack of planarity in the lower layers is emphasized and has an increasingly more severe detrimental effect as the number of overlying layers increases. For this reason of flattening a surface, conventional technology provides methods for forming dummy patterns that are aimed at enhancing the planarity of individual layers of a stack of overlying layers and therewith the planarity of the total structure. The dummy patterns may comprise patterned layers of metal or dummy plugs. Openings for dummy plugs that are created for the purpose of enhancing the ability to create multiple overlying layers of interconnect metal typically are etched through a layer of insulating material thereby stopping on the surface of an etch stop layer. This creates an interface between the dummy plugs and the underlying layer of etch stop material, which is characterized by weak mechanical bonding between the layer of etch stop material and the dummy plug. It is well known in the art that low-k dielectric materials typically have low thermal conductivity making these materials more susceptible to dielectric cracking and delamination under and around interfaces with for instance dummy plugs. The dummy plug is therefore prone to "shift" over the surface of the layer of etch stop material, resulting in an unstable structure of overlying layers of insulation material and therein or there-over created networks of interconnect metal. The invention addresses this concern by providing dummy plugs that are firmly anchored within the structure of interconnect metal.

U.S. Pat. No. 6,103,626 (Kim) shows a method for forming dummy pattern areas in a semiconductor device.

U.S. Pat. No. 6,259,115 (You, et al.) teaches a method for inserting dummy conductive channels along with the interconnected conductive channels. The dummy channels have an approximately even metal weight distribution.

U.S. Pat. No. 6,150,232 (Chan, et al.) discloses a method for creating low intra-level dielectric interface between conducting lines using conventional deposition and etching processes. A layer of conducting lines is formed interspersed with dielectric material.

U.S. Pat. No. 6,087,733 (Maxim, et al.) shows sacrificial erosion control features for chemical-mechanical polishing process.

SUMMARY OF THE INVENTION

A principle objective of the invention is to provide a stable structure of multiple layers of interconnect traces separated by a low-k dielectric material.

Another objective of the invention is to provide a method of using a low-k dielectric material for the creation of multiple layers of interconnect traces whereby problems of dielectric peeling during processes of Chemical Mechanical Polishing and dielectric delamination are eliminated.

Yet another objective of the invention is to provide a method of strengthening a stack of overlying interconnect traces using a low-k dielectric as an insulating material such that effects of uneven plug fill during the creation of dummy plugs are eliminated.

Yet another objective of the invention is to provide a method of strengthening a stack of overlying interconnect traces using a low-k dielectric as an insulating material that allows for a reduction in dummy plug density.

In accordance with the objectives of the invention a new method is provided for the creation of dummy plugs in support of creating a robust structure of overlying interconnect traces. A pattern of holes for dummy plugs is etched stopping at an etch stop layer, the etch stop layer is then removed from the bottom of the holes that have been created whereby this removal is extended into an underlying layer of insulating material. The pattern of holes is filled with a metal, preferably copper, excess metal is removed by methods of Chemical Mechanical Polishing, leaving in place a pattern of metal plugs that penetrate through layers of insulation material and through layers of etch stop material and into an underlying layer of semiconductor material.

DESCRIPTION OF THE PREFERRED EMBODIMENTS

Figure 1:
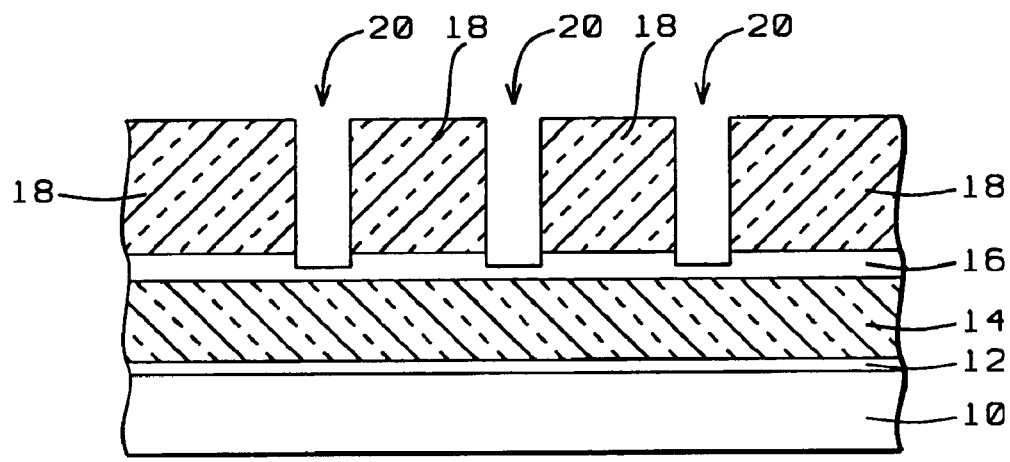
FIG. 1 is a cross section of a semiconductor substrate over the surface of which have been deposited layers of low-k dielectric interspersed with layers of etch stop material.

Referring now specifically to the cross section that is shown in FIG. 1, therein are highlighted:
the semiconductor substrate 10
a first layer 12 of etch stop material deposited over the surface of substrate 10
first layer 14 of insulating material, preferably comprising a low-k Inter Metal Dielectric (IMD) material, deposited over the surface of the first layer 12 of etch stop material
a second layer 16 of etch stop material deposited over the surface of the first layers 14 of insulating material, and
finally a second layer 18 of insulating material, preferably comprising a low-k IMD material, deposited over the surface of the second layer 16 of etch stop material.

As examples of silicate based low-k dielectric constant materials can be cited carbon doped silicates, spin-on low-k materials and polymeric materials, low-k polymer materials that include polyimides, fluorinated polyimides, polysilsequioxane, benzocyclobutene (BCB), parlene F, parlene N and amorphous polytetrafluorothylene.

As material for the layers of etch stop material can be used aluminum, silicon, titanium, zirconium, hafnium, chromium, molybdenum, tungsten, copper, silver, gold, platinum, combinations thereof, conductive alloys thereof such as titanium-tungsten alloy and CVD silicon, silicon nitride, nitride, carbide and composite films like oxide/carbide, oxide/nitride and the like.

The method that is used for the deposition of the layers of IMD and the layers of etch stop material are well known in the art and will therefore not be further specified at this time. In addition, the thickness to which the various layers of etch stop material and IMD are deposited is application dependent and may vary between for instance 200 and 2,000 Angstrom for an etch stop layer and between 2,000 and 15,000 Angstrom for a layer of IMD insulating material. The invention is not limited by the thickness to which these various layers are deposited, this thickness is determined by factors other than limitations that would be inherent in the invention.

The pattern of openings 20 that are shown in cross section in FIG. 1 is the pattern of dummy plugs that are to be created.

Figure 2:
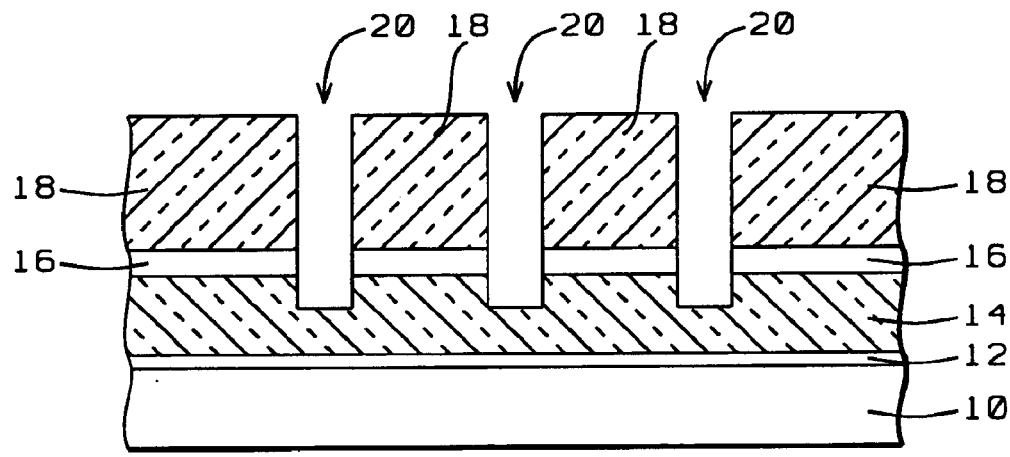
FIG. 2 is a cross section of the substrate after holes have been created for dummy plugs, penetrating through an etch stop layer.

In the cross section of FIG. 2, it is shown that the holes 20 for the dummy plugs have now been extended in depth by etching, in accordance with the pattern of holes 20, through the second layer 16 of etch stop material and into the first layer 14 of IMD. The depth to which the etch is extended into layer 14 of IMD is not critical. Critical to the invention is that this etch removed all etch stop material of layer 16 in accordance with the pattern of openings 20 and that this etch extends into the surface of layer 14 of IMD over a distance. This distance is preferably between about 1,000 and 10,000 Angstrom.

Methods of etching and the thereby applied processing conditions are highly dependent on the materials that are selected for the etch stop layer 16 and the layer 14 of IMD. Any specifics relating to these conditions will therefore not be provided at this time, further in view of the observation that these conditions are not critical to the invention.

Figure 3:
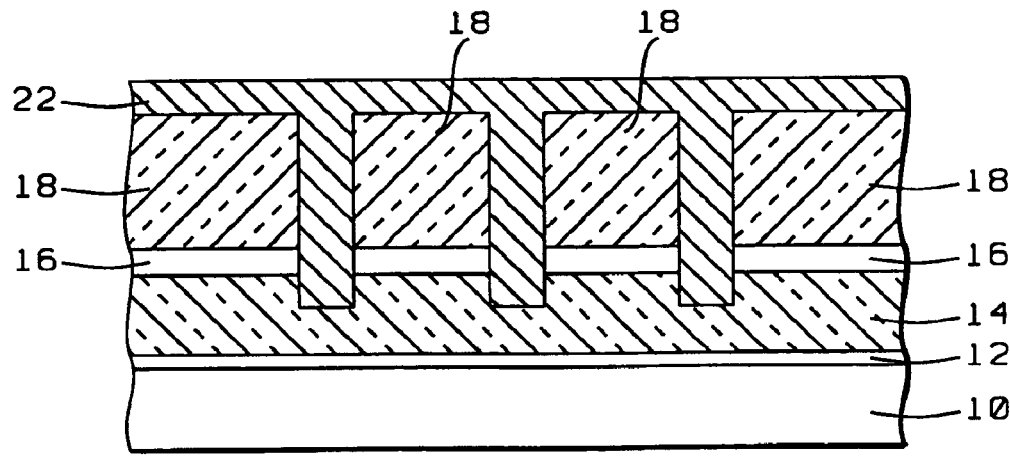
FIG. 3 is a cross section of the substrate after a layer of metal has been deposited, filling the dummy holes therewith.

The cross section that is shown in FIG. 3 shows a layer 22 of metal, preferably comprising copper, having been deposited over the surface of the second layer 18 of IMD material, thereby filling holes 20 with copper. By removing, applying methods of CMP, excess copper from the surface of layer 18 as shown in cross section in FIG. 4, the dummy plugs 22 are created, preferably filled with copper.

Figure 4:
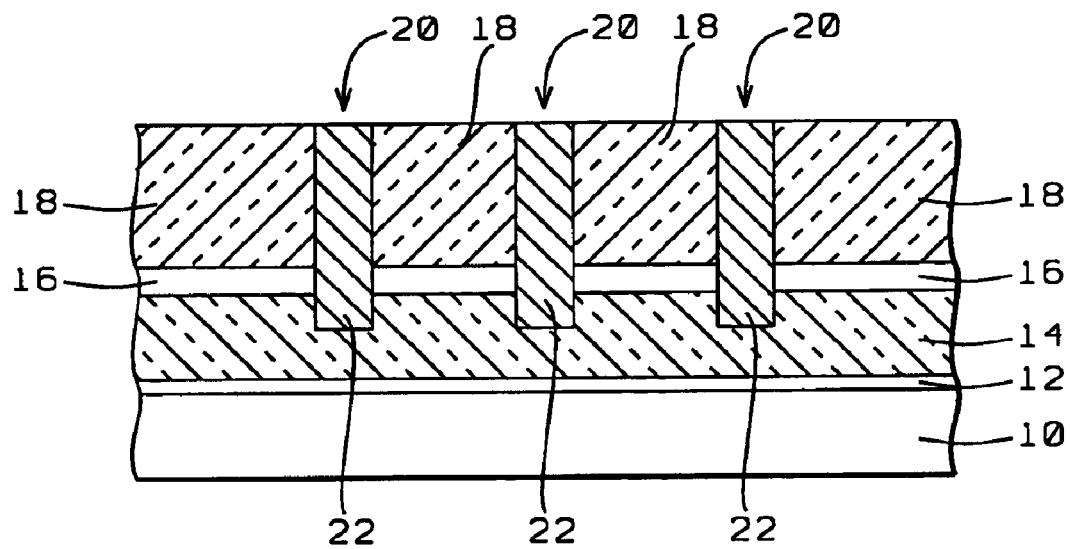
FIG. 4 shows a cross section after excess metal has been removed from the surface of the structure.

It must be noted in the cross section that is shown in FIG. 4 that the dummy plugs 22 penetrate through the openings created in the second layer 16 of etch stop material and partially penetrate into the first layer 14 of IMD. Problems of delamination of the dummy plugs have therefore been eliminated. In addition, the dummy plugs are, where these plugs penetrate the second layer 16 of etch stop material, supported by the surrounding layer 16 of etch stop material. This support prevents the dummy plugs 22 from moving in a lateral direction, which is a direction that is parallel with the surface of for instance substrate 10. The dummy plugs are as a consequence firmly anchored in the first layer 14 of IMD, in the second layer 16 of etch stop material and in the second layer 18 of IMD.

The dummy plugs that have been created following FIGS. 1 through 4 and in accordance therewith, are not limited to being created only through one layer of etch stop material or through one layer of IMD followed by partial embedding of the dummy plugs into an underlying layer of IMD. The basic concept of anchoring dummy plugs through a layer of etch stop material can readily be extended whereby one or more layers of etch stop material are used for this purpose, whereby the lowest layer of etch stop material is additionally penetrated and the holes for the dummy plugs are extended through this penetration into an underlying layer of semiconductor material, this underlying layer of semiconductor material preferably comprising but not being limited to IMD material. It is thereby entirely feasible to further cover the dummy plugs 22, that are shown in cross section in FIG. 4, with yet another layer of semiconductor material such as for instance a layer of etch stop material from which point the dummy plugs 22 are considered buried. After burying the dummy plugs in this manner, as yet another layer of dummy plugs may be created that are essentially created independent of the first layer of dummy plugs that is shown in cross section in FIG. 4. This results in one or more layers of dummy plugs, each layer created at a level of elevation from the surface of the substrate 10, whereby however the plugs of each level of dummy plugs are anchored as shown in cross section in FIG. 4. This anchoring is critical to the invention since the anchoring provides for stress propagation, the stress within the layers of IMD material being modified and distributed throughout the layer of IMD.

Figure 5:
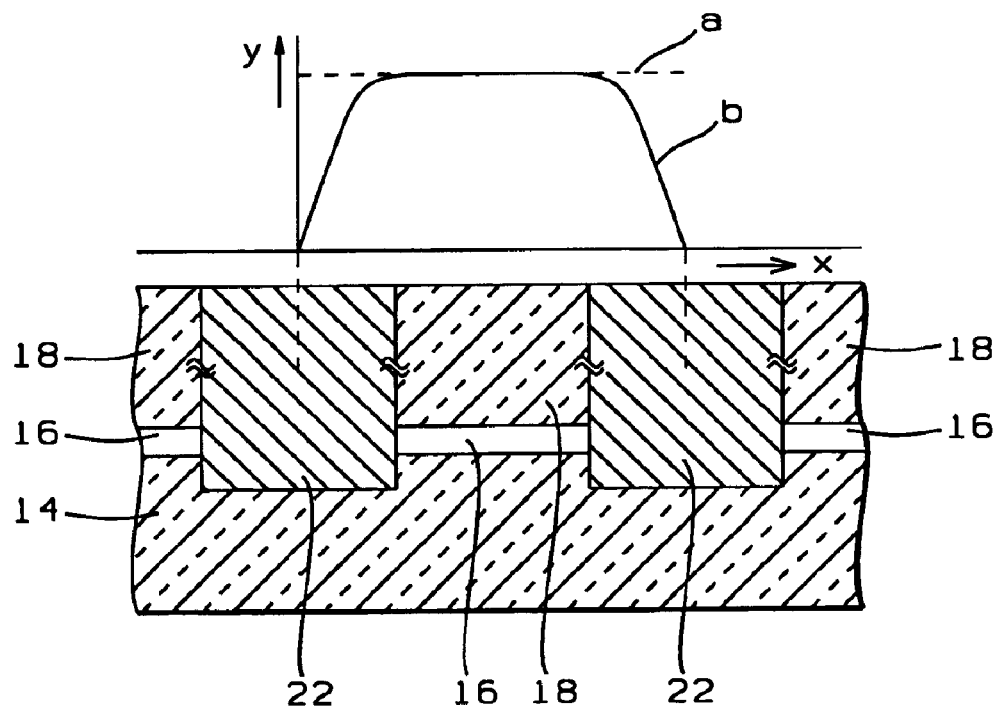
FIG. 5 shows a cross section of dummy plugs created by the invention and the therewith-related stress pattern.

Experimental results that confirm the invention have been obtained and are shown in FIG. 5. The interface stress is measured over the surface of the second layer 18 of IMD.

The X coordinate in FIG. 5 is the distance along the surface of the second layer 18 of IMD as this distance relates to the created underlying dummy plugs 22, the Y coordinate represents the stress that is measured along the surface of the layer 18 of IMD.

Curve "a" of FIG. 5 represents the interface stress over the surface of the layer 18 of IMD for applications where the dummy plugs do not penetrate a layer 16 of etch stop material, that is creating dummy plugs as conventionally performed (not shown in FIG. 5). It is seen from curve "a" that the interface stress is uniform and of a relatively high level.

Curve "b" represents the interface stress measured over the surface of layer 18 for the cross section that is shown in FIG. 5 comprising the underlying dummy plugs, which, as shown, penetrate in accordance with the invention through the layer 16 of etch stop material and into the layer 14 of insulating material. Curve "b" shows that the interface stress sharply declines over the center of the dummy plugs. This sharp reduction and dependent on the number and pitch of the created dummy plugs, reduces the average or actual interface stress that is present over the surface of the layer 18 of IMD. By decreasing the pitch of the dummy plugs or by increasing the number of dummy plugs that are created, this reduction in the interface stress can be further increased in magnitude.

From the results that are shown in FIG. 5 it can be concluded that the invention, by anchoring the dummy plugs through at least one underlying layer of etch stop material and by controlling the density and the pitch of the created dummy plugs, provides a method for the reduction of interface stress over the surface of a layer of semiconductor material through which the dummy plugs are created.

From the results that are shown in FIG. 5 it can further be concluded that for applications where a given level of stress reduction is required, the number of dummy plugs can be reduced as long as these dummy plugs are created in accordance with the invention.

It stands to reason that the dummy plugs of the invention, in order to most readily provide these dummy plugs, are most advantageously placed in surface areas of the wafer that are not used for conventional purposes of the creation of semiconductor devices, that is in blanket surface areas of the wafer.

It must further be pointed out that, by allowing a reduction in the density or concentrating of the dummy plugs, the metal fill of the dummy plugs will be improved. Using the conventional methods, whereby the filling of dummy plugs coincides with filling densely packed via openings created over a large surface area of the wafer, the complete and uniform filling of the dummy plugs is a problem. Reducing the dummy plug density and placing the dummy plugs in the blanket parts of the wafer results in improved filling of the dummy plugs.

Whereas the cross sections of FIGS. 1 through 4 have shown a first layer 12 of etch stop material deposited over the surface of a substrate 10 with a first layer 14 of insulating material deposited over the surface of layer 12, the invention also allows for the elimination of these two first layers 12 and 14 and for therefore extending the dummy plugs 22 into the surface of the underlying substrate 10.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of providing for a stable structure by creating dummy plugs over a semiconductor substrate, comprising the steps of:

providing a semiconductor substrate, said substrate having been provided with multiple layers of metal interconnect traces separated by a layer of insulating material;

depositing a layer of etch stop material over said substrate;

depositing a layer of insulating material over said layer of etch stop material;

etching holes for a pattern of dummy plugs through said layer of insulating material and through said layer of etch stop material, extending the dummy plugs into the surface of the underlying substrate, said pattern of dummy plugs being adjusted for maximum stress reduction in said layer of insulating material and said layer of etch stop material, said pattern of dummy plugs further being adjusted to eliminate effects of uneven plug fill during creation of the dummy plugs; and filling said holes with a metal, thereby providing for creating a stable and strengthened stack of overlying interconnect traces separated by a layer of insulating material while further allowing for a reduction in dummy plug density.

2. The method of claim 1, said insulating material comprising a low-k dielectric material.

3. The method of claim 1, said metal comprising copper.

4. The method of claim 1, said holes for a pattern of dummy plugs overlying a blanket surface area of said substrate.

5. The method of claim 1, said filling said holes with a metal comprising a step of blanket deposition of said metal over said layer of insulating material followed by a step of removing excess metal from said layer of insulating material.

6. The method of claim 5, said removing excess metal from said layer of insulating material comprising applying methods of Chemical Mechanical Polishing (CMP), thereby eliminating peeling of insulating material during said applying methods of CMP.

7. A method of providing for a stable structure by creating dummy plugs through at a layer of low-k dielectric material, comprising the steps of:

providing a semiconductor substrate, said substrate having been provided with multiple layers of metal interconnect traces separated by a layer of low-k dielectric;

depositing a layer of etch stop material over said substrate;

depositing a layer of low-k dielectric material said layer of etch stop material;

etching holes for a pattern of dummy plugs through said layer of low-k dielectric material and through said layer of etch stop material, extending the dummy plugs into the surface of the underlying substrate, said pattern of dummy plugs being adjusted for maximum stress reduction in said layer of low-k dielectric material and said layer of etch stop material, said pattern of dummy plugs further being adjusted to eliminate effects of uneven plug fill during creation of the dummy plugs; and filling said holes with a metal, thereby providing for creating a stable and strengthened stack of overlying interconnect traces separated by a layer of low-k dielectric while further allowing for a reduction in dummy plug density.

8. The method of claim 7, said metal comprising copper.

9. The method of claim 7, said holes for a pattern of dummy plugs overlying a blanket surface area of said substrate.

10. The method of claim 7, said filling said holes with a metal comprising a step of blanket deposition of said metal over said layer of low-k dielectric followed by a step of removing excess metal from said layer of low-k dielectric.

11. The method of claim 10, said removing excess metal from said layer of low-k dielectric comprising applying methods of Chemical Mechanical Polishing (CMP), thereby eliminating peeling of low-k dielectric during said applying methods of CMP.

12. A method of providing for a stable structure by creating dummy copper plugs through a layer of low-k dielectric material, comprising the steps of:
   providing a semiconductor substrate, said substrate having been provided with multiple layers of metal interconnect traces separated by a layer of insulating material;
   depositing a layer of etch stop material over said substrate;
   depositing a layer of low-k dielectric material over said layer of etch stop material;
   etching holes for a pattern of dummy plugs through said layer of low-k dielectric material and through said layer of etch stop material, extending the dummy plugs into the surface of the underlying substrate, said pattern of dummy plugs being adjusted for maximum stress reduction in said layer of low-k dielectric material and said layer of etch stop material, said pattern of dummy plugs further being adjusted to eliminate effects of uneven plug fill during creation of the dummy plugs; and
   filling said holes with copper, thereby providing for creating a stable and strengthened stack of overlying interconnect traces separated by said layer of low-k dielectric while further allowing for a reduction in dummy plug density.

13. The method of claim 12, said holes for a pattern of dummy plugs overlying a blanket surface area of said substrate.

14. The method of claim 12, said filling said holes with a copper comprising a step of blanket deposition of said copper over said layer of low-k dielectric material followed by a step of removing excess metal from said layer of low-k dielectric material.

15. The method of claim 14, said removing excess copper from said layer of low-k dielectric material comprising applying methods of Chemical Mechanical Polishing (CMP), thereby eliminating peeling of insulating material during said applying methods of CMP.

16. A method of providing for a stable structure by creating dummy plugs as part of the creation of semiconductor devices, comprising the steps of:
   providing a semiconductor substrate, said substrate having been provided with multiple layers of metal interconnect traces separated by at least one layer of insulating material;
   depositing a first layer of etch stop material over said substrate;
   depositing a first layer of insulating material over said first layer of etch stop material;
   depositing at least one second layer of etch stop material over said first layer of insulating material;
   depositing at least one second layer of insulating material over said at least one second layer of etch stop material;
   etching holes for a pattern of dummy plugs through said at least one second layer of insulating material and through said at least one second layer of etch stop material, extending the dummy plugs into the surface of the underlying first layer of insulating material, said pattern of dummy plugs being adjusted for maximum stress reduction in said at least one second layer of insulating material and said at least one second layer of etch stop material and said first layer of insulating material, said pattern of dummy plugs further being adjusted to eliminate effects of uneven plug fill during creation of the dummy plugs; and
   filling said holes with a metal, thereby providing for creating a stable and strengthened stack of overlying interconnect traces separated by said at least one second layer of insulating material and said at least one second layer of etch stop material while further allowing for a reduction in dummy plug density.

17. The method of claim 16, said insulating material comprising a low-k dielectric material.

18. The method of claim 16, said metal comprising copper.

19. The method of claim 16, said holes for a pattern of dummy plugs overlying a blanket surface area of said substrate.

20. The method of claim 16, said filling said holes with a metal comprising a step of blanket deposition of said metal over said at least one second layer of insulating material followed by a step of removing excess metal from said at least one second layer of insulating material.

21. The method of claim 20, said removing excess metal from said at least one layer of insulating material comprising applying methods of Chemical Mechanical Polishing (CMP), thereby eliminating peeling of insulating material during said applying methods of CMP.

22. A method of providing for a stable structure by creating dummy plugs through at least one layer of low-k dielectric material, comprising the steps of:
   providing a semiconductor substrate, said substrate having been provided with multiple layers of metal interconnect traces separated by at least one layer of low-k dielectric;
   depositing a first layer of etch stop material over said substrate;
   depositing a first layer of low-k dielectric material over said first layer of etch stop material;
   depositing at least one second layer of etch stop material over said first layer of low-k dielectric material;
   depositing at least one second layer of low-k dielectric material over said at least one second layer of etch stop material;
   etching holes for a pattern of dummy plugs through said at least one second layer of low-k dielectric material and through said at least one second layer of etch stop material, extending the dummy plugs into the surface of the underlying first layer of low-k dielectric material, said pattern of dummy plugs being adjusted for maximum stress reduction in said at least one second layer of low-k dielectric material and said at least one second layer of etch stop material and said first layer of low-k dielectric material, said pattern of dummy plugs further being adjusted to eliminate effects of uneven plug fill during creation of the dummy plugs; and
   filling said holes with a metal, thereby providing for creating a stable and strengthened stack of overlying interconnect traces separated by said at least one second layer of low-k dielectric material and said at least one second layer of etch stop material while further allowing for a reduction in dummy plug density.

23. The method of claim 22, said metal comprising copper.

24. The method of claim 22, said holes for a pattern of dummy plugs overlying a blanket surface area of said substrate.

25. The method of claim 22, said filling said holes with a metal comprising a step of blanket deposition of said metal over said at least one second layer of low-k dielectric material followed by a step of removing excess metal from said at least one second layer of low-k dielectric material.

26. The method of claim 25, said removing excess metal from the surface of said at least one second layer of low-k dielectric material comprising applying methods of Chemical Mechanical Polishing (CMP), thereby eliminating peeling of low-k dielectric material during said applying methods of CMP.

27. A method of providing for a stable structure by creating dummy copper plugs through at least one layer of low-k dielectric material, comprising the steps of:
  providing a semiconductor substrate, said substrate having been provided with multiple layers of metal interconnect traces separated by at least one layer of low-k dielectric material;
  depositing a first layer of etch stop material over said substrate;
  depositing a first layer of low-k dielectric material over said first layer of etch stop material;
  depositing at least one second layer of etch stop material over said first layer of low-k dielectric material;
  depositing at least one second layer of low-k dielectric material over said at least one second layer of etch stop material;
  etching holes for a pattern of dummy plugs through said at least one second layer of low-k dielectric material and through said at least one second layer of etch stop material, extending said dummy plugs into the surface of the underlying first layer of low-k dielectric material, said pattern of dummy plugs being adjusted for maximum stress reduction in said at least one second layer of low-k dielectric material and said at least one second layer of etch stop material and said first layer of low-k dielectric material, said pattern of dummy plugs further being adjusted to eliminate effects of uneven plug fill during creation of the dummy plugs; and
  filling said holes with copper, thereby providing for creating a stable and strengthened stack of overlying interconnect traces separated by said at least one second layer of low-k dielectric material and said at least one second layer of etch stop material while further allowing for a reduction in dummy plug density.

28. The method of claim 27, said holes for a pattern of dummy plugs overlying a blanket surface area of said substrate.

29. The method of claim 27, said filling said holes with copper comprising a step of blanket deposition of said copper over said at least one second layer of low-k dielectric material followed by a step of removing excess copper from said at least one second layer of low-k dielectric material.

30. The method of claim 29, said removing excess copper from said at least one second layer of low-k dielectric material comprising applying methods of Chemical Mechanical Polishing (CMP), thereby eliminating peeling of insulating material during said applying methods of CMP.

31. A method of providing for a stable structure by creating dummy plugs as part of the creation of semiconductor devices, comprising the steps of:
  providing a semiconductor substrate, said substrate having been provided with multiple layers of metal interconnect traces separated by a layer of insulating material;
  depositing a first layer of etch stop material over said substrate;
  depositing a first layer of semiconductor material over said first layer of etch stop material;
  depositing at least one second layer of etch stop material over said first layer of semiconductor material;
  depositing at least one second layer of insulating material over said at least one second layer of etch stop material;
  etching holes for a pattern of dummy plugs through said at least one second layer of insulating material and through said at least one second layer of etch stop material, extending said dummy plugs into the surface of the underlying layer of semiconductor material, said pattern of dummy plugs being adjusted for maximum stress reduction in said at least one second layer of insulating material and said at least one second layer of etch stop material and said underlying layer of semiconductor material, said pattern of dummy plugs further being adjusted to eliminate effects of uneven plug fill during creation of the dummy plugs; and
  filling said holes with a metal, thereby providing for creating a stable and strengthened stack of overlying interconnect traces separated by said at least one second layer of insulating material and said at least one second layer of etch stop material while further allowing for a reduction in dummy plug density.

32. The method of claim 31, said insulating material comprising a low-k dielectric material.

33. The method of claim 31, said metal comprising copper.

34. The method of claim 31, said holes for a pattern of dummy plugs overlying a blanket surface area of said substrate.

35. The method of claim 31, said filling said holes with a metal comprising a step of blanket deposition of said metal over said at least one second layer of insulating material followed by a step of removing excess metal said at least one second layer of insulating material.

36. The method of claim 35, said removing excess metal from said at least one layer of insulating material comprising applying methods of Chemical Mechanical Polishing (CMP), thereby eliminating peeling of insulating material during said applying methods of CMP.

37. A method of providing for a stable structure by creating dummy plugs through at least one layer of low-k dielectric material, comprising the steps of:
  providing a semiconductor substrate, said substrate having been provided with multiple layers of metal interconnect traces separated by a layer of insulating material;
  depositing a first layer of etch stop material over said substrate;
  depositing a first layer of low-k dielectric material over said first layer of etch stop material;
  depositing at least one second layer of etch stop material over said first layer of low-k dielectric material;
  depositing at least one second layer of low-k dielectric material over said at least one second layer of etch stop material;
  etching holes for a pattern of dummy plugs through said at least one second layer of low-k dielectric material and through said at least one second layer of etch stop material, extending the dummy plugs into the surface of the underlying first layer of low-k dielectric material, said pattern of dummy plugs being adjusted for maximum stress reduction in said at least one second layer of low-k dielectric material and said at least one second layer of etch stop material and said first layer of low-k dielectric material, said pattern of dummy plugs further being adjusted to eliminate effects of uneven plug fill during creation of the dummy plugs; and filling said holes with a metal, thereby providing for creating a stable and strengthened stack of overlying interconnect traces separated by said at least one second layer of low-k dielectric material and by said at least one second layer of etch stop material while further allowing for a reduction in dummy plug density.

38. The method of claim 37, said metal comprising copper.

39. The method of claim 37, said holes for a pattern of dummy plugs overlying a blanket surface area of said substrate.

40. The method of claim 37, said filling said holes with a metal comprising a step of blanket deposition of said metal over said at least one second layer of low-k dielectric material followed by a step of removing excess metal from said at least one second layer of low-k dielectric material.

41. The method of claim 40, said removing excess metal from said at least one second layer of low-k dielectric material comprising applying methods of Chemical Mechanical Polishing (CMP), thereby eliminating peeling of low-k dielectric material during said applying methods of CMP.

42. A method of providing for a stable structure by creating dummy copper plugs through at least one layer of low-k dielectric material, comprising the steps of:

providing a semiconductor substrate, said substrate having been provided with multiple layers of metal interconnect traces separated by a layer of insulating material;

depositing a first layer of etch stop material over said substrate;

depositing a first layer of low-k dielectric material over said first layer of etch stop material;

depositing at least one second layer of etch stop material over said first layer of low-k dielectric material;

depositing at least one second layer of low-k dielectric material over said at least one second layer of etch stop material;

etching holes for a pattern of dummy plugs through said at least one second layer of low-k dielectric material and through said at least one second layer of etch stop material, extending said dummy plugs into the surface of the underlying first layer of low-k dielectric material, said pattern of dummy plugs being adjusted for maximum stress reduction in said at least one second layer of low-k dielectric material and said at least one second layer of etch stop material and said first layer of low-k dielectric material, said pattern of dummy plugs further being adjusted to eliminate effects of uneven plug fill during creation of the dummy plugs; and filling said holes with copper, thereby providing for creating a stable and strengthened stack of overlying interconnect traces separated by said at least one second layer of low-k dielectric material and said at least one second layer of etch stop material while further allowing for a reduction in dummy plug density.

43. The method of claim 42, said holes for a pattern of dummy plugs overlying a blanket surface area of said substrate.

44. The method of claim 42, said filling said holes with a copper comprising a step of blanket deposition of said copper over said at least one second layer of insulating material followed by a step of removing excess copper from said at least one second layer of low-k dielectric.

45. The method of claim 44, said removing excess metal from said at least one second layer of low-k dielectric comprising applying methods of Chemical Mechanical Polishing (CMP), thereby eliminating peeling of insulating material during said applying methods of CMP.

* * * * *